United States Patent [19]
Walden

[11] Patent Number: 5,706,356
[45] Date of Patent: Jan. 6, 1998

[54] AUDIO PROCESSOR

[76] Inventor: Gaylord K. Walden, 13421 Huntington St., Fontana, Calif. 92336

[21] Appl. No.: 640,497

[22] Filed: May 1, 1996

[51] Int. Cl.$^6$ ........................................... H03G 7/00
[52] U.S. Cl. .................................... 381/106; 333/14
[58] Field of Search .................... 381/13, 106, 104, 381/107, 119–120; 333/14

[56] References Cited

U.S. PATENT DOCUMENTS

| | | | |
|---|---|---|---|
| 4,677,645 | 6/1987 | Kaniwa | 381/106 |
| 4,701,953 | 10/1987 | White | 381/106 |
| 5,418,859 | 5/1995 | Cho | 381/98 |
| 5,586,193 | 12/1996 | Ichise et al. | 381/106 |
| 5,633,939 | 5/1997 | Kitani et al. | 381/106 |

*Primary Examiner*—Curtis Kuntz
*Assistant Examiner*—Xu Mei
*Attorney, Agent, or Firm*—Albert O. Cota

[57] ABSTRACT

An audio processor (10) that is specifically designed to be included in combination with an audio recording system or a movie theater sound system. The processor (10) consists of two major circuits, a single-ended, limited compressor/expander circuit (12) and an output circuit (205) that incorporates a dynamic noise reduction (DNR) circuit (206). A single adjustment sets the trip points for both the low-level and high-level operating mode of the compressor/expander circuit (12). Likewise, a single adjustment sets the bandwidth of the DNR circuit (206). When the processor is in the expand mode, the two circuits (12,206) complement each other such that when the low-level expander lowers the signal level, the source noise is also reduced. The reduced signal results in an earlier activation of the DNR circuit (206) bandwidth control which reduces its bandwidth resulting in a further reduction of the noise level. The audio processor (10) operates to produce a warmer, more natural reproduction of the music while reducing noise levels.

14 Claims, 9 Drawing Sheets

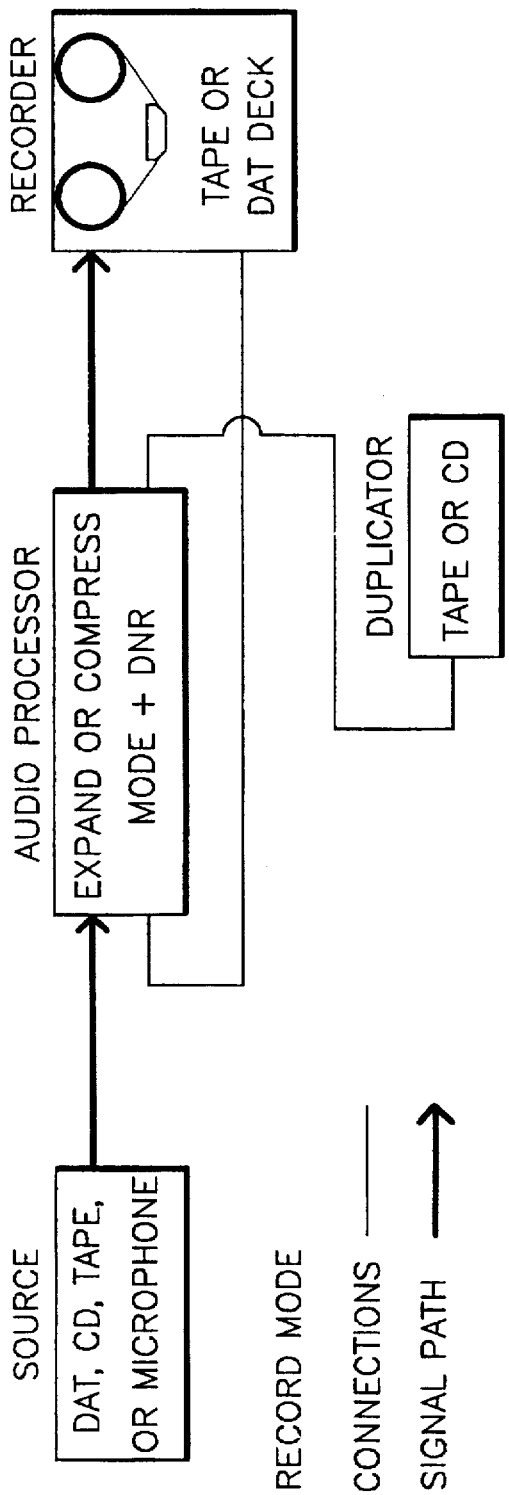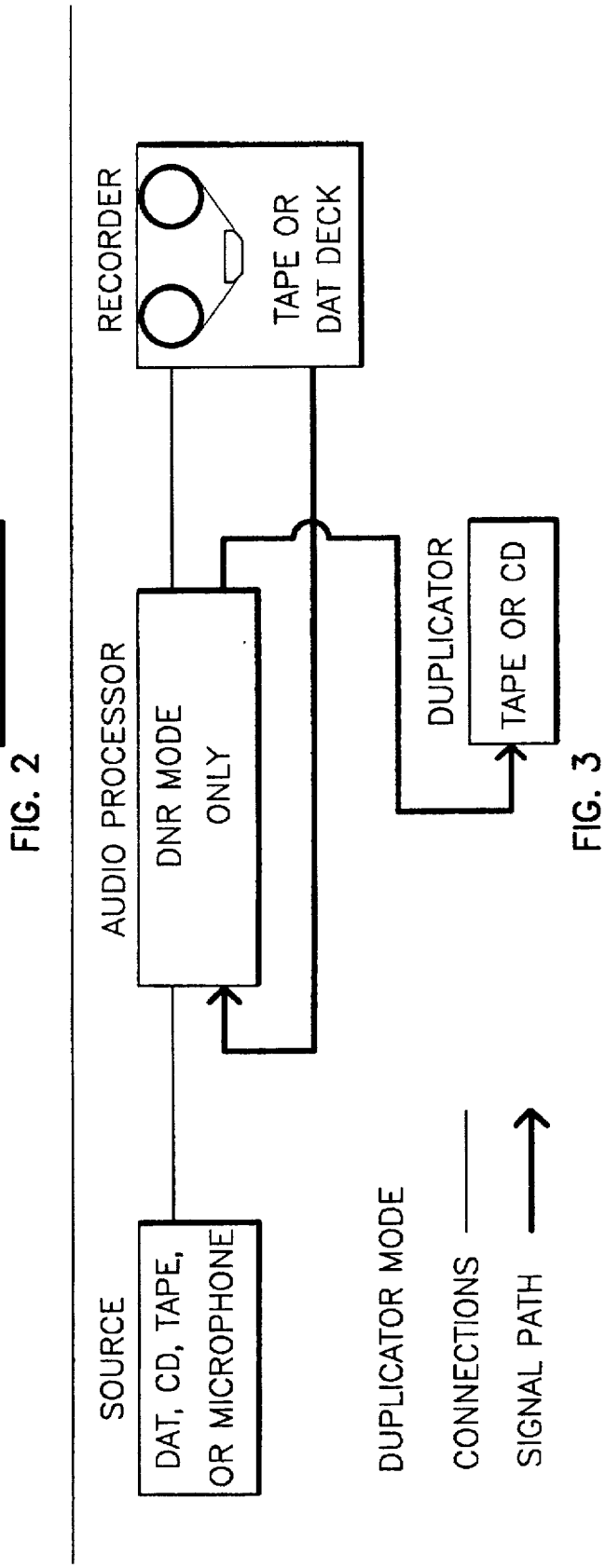
FIG. 2
FIG. 3

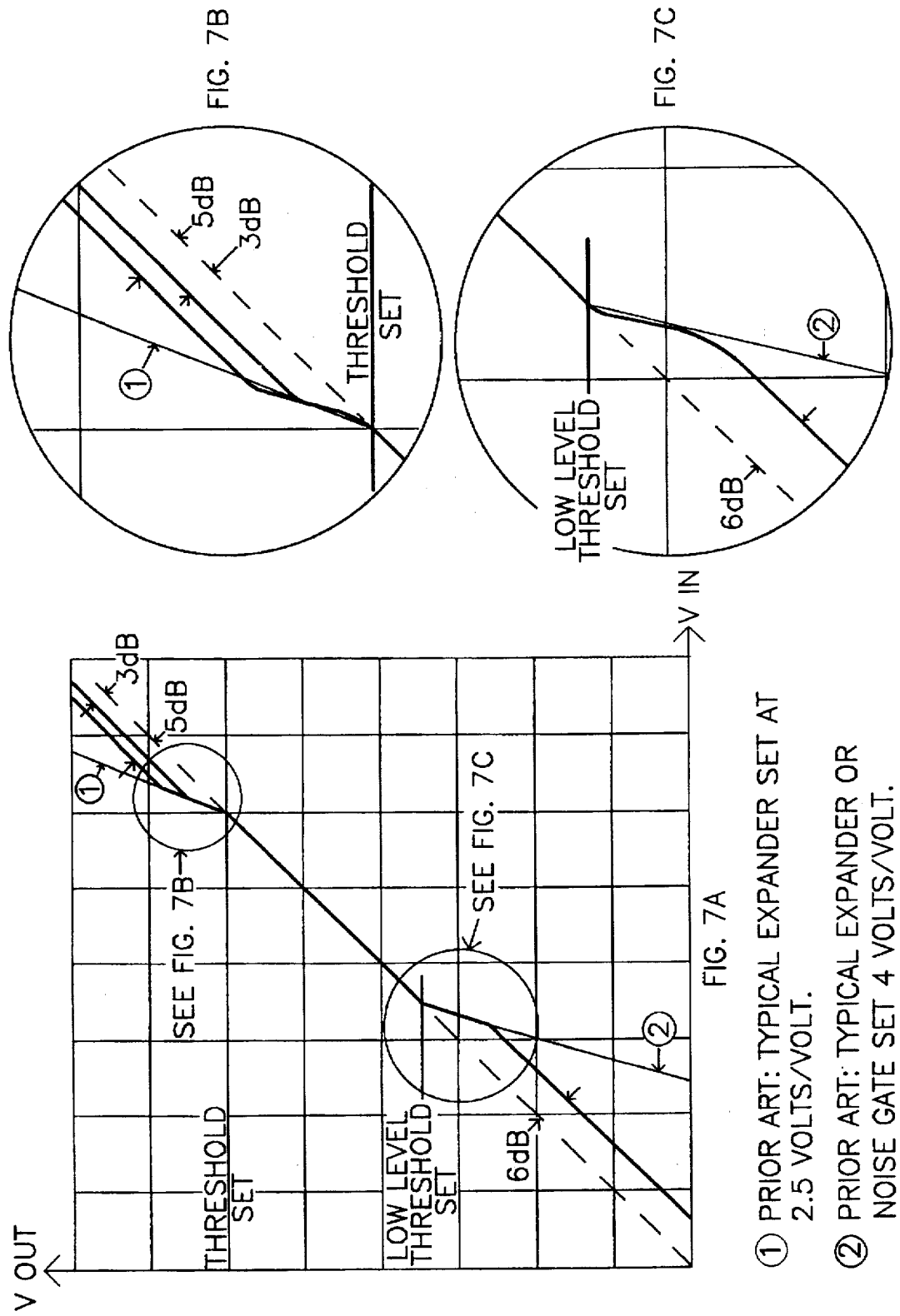

AUDIO PROCESSOR

TECHNICAL FIELD

This invention pertains to the general field of audio processing systems and more particularly to a single-ended, dual-level audio processor that is primarily designed to enhance audio recording systems and movie theater sound systems.

BACKGROUND ART

In the process of making commercial audio recordings, such as compact disks (CD), cassette tapes, or movie sound systems, many of the signals are compressed or expanded to provide a "proper" balance, mask noise levels, provide adequate head space, etc. The music is further compressed during the final mix due to peak limiting and gain riding. The net result is that the music loses some of its dynamics and warmth. To increase the dynamics during final mix requires lowering the recording levels to provide head space and thus, results in decreased signal-to-noise ratios. Digital Audio Tape (DAT) recorders are sometimes used to provide increased head space, but again the recording looses some of its remaining "warmth" due to the limited update rate and bit limitations of the DAT.

There are presently three major digital sound systems that are installed in theaters: Dolby Digital®, Digital Theater Systems (DTS™) and Sony Dynamic Digital Sound (SDDS).

The Dolby system includes three subsystems: Dolby digital, Dolby SR and Dolby. The Dolby digital is the only one with digitally encoded sound that is recorded between the sprocket holes of the film. Until the advent of digital sound in the early 1990's, the Dolby SR was the high-end theater sound system, and the one most commonly in use in theaters in North America. The Dolby system, which is used for reducing background hissing on recorded sound, use up to 10 dB of head space as it is a double-ended system. Thus, it increases the signal level during the recording phase and reduces the signal level during the playback phase which subsequently results in the reduction of noise.

The DTS system utilizes a sound track that is recorded on a compact disk (CD). The CD is played on processors that are synchronized to the time code on the film. The SDDS system utilizes a sound track that is encoded on both edges of the film.

The above three systems can be operated in combination with a THX system. THX is not a recording system, but a set of standards developed by Lucasfilm Inc. for optimizing acoustics in theaters, regardless of the sound format. To be certified as THX theater, an auditorium must meet the THX program's criteria for design, construction, insulation, equipment and other factors.

The audio process disclosed herein allows a user to turn off the Dolby system which increases usable head space by approximately 10 dB with no increase in noise levels. The audio processor also increases the dynamic Tangs of the music by as much as 12 dB while only using up 5 dB of head space. The result is a recording that is: (1) 5 dB hotter than that obtained with the Dolby system, with no increase in distortion levels; (2) has a signal-to-noise ratio that meets or exceeds that obtained with the Dolby system and (3) provides increased dynamics which results in a warmer, more natural reproduction of the music or other audio sounds.

A search of the prior art did not disclose any industry literature or patents that read on the claim of the instant invention. However, the following U.S. patents are considered related:

| U.S. Pat. No. | INVENTOR | ISSUED |
| --- | --- | --- |
| 5,297,213 | Holden | 22 March 1994 |
| 4,677,645 | Kaniwa et al | 30 June 1987 |
| 4,224,581 | Watanabe et al | 23 September 1980 |

The U.S. Pat. No. 5,297,213 issued to Holden discloses a noise reduction system for removing unwanted audio noise during a pause. The system receives an intelligence plus noise signal that is split and fed to a first rectifier having a first polarity, and through a filter to a second rectifier having a polarity opposite to the first rectifier. The filter removes components below a frequency where most energy-frequency is distributed in human speech. The output of the rectifiers is summed to produce an output signal where most audio noise between pauses in voice is reduced.

The U.S. Pat. No. 4,677,645 issued to Kaniwa et al discloses an audio signal transmission system having a noise reduction circuit. The circuit includes a transmission medium such as a magnetic tape which is used to transmit a digital signal converted from an input audio signal and then to output the audio signal reproduced from the digital signal. The circuit further includes a digital signal transmitter having a pulse-code modulator and a demodulator (MODEM). The noise reduction circuit includes a compressor for compressing the dynamic range of the input audio signal according to the detection level obtained by detecting at least the high-frequency components thereof, in order to supply the output from the compression to the digital signal transmitter. The circuit also includes an expander for expanding the dynamic range of the demodulated signal from the transmitter according to the detection level of at least the high-frequency components.

The U.S. Pat. No. 4,224,581 issued to Watanabe et al discloses a noise reduction system which includes an encoder and a decoder. The encoder is used to compress the dynamic range of an analog audio signal and the decoder is coupled to the transmission medium for expanding and thereby restoring the dynamic range of the compressed analog audio signal. The encoder includes a voltage controlled amplifier (VCA) that receives the audio signal, a high-pass filter also coupled to the analog audio signal, a circuit for obtaining a difference between the outputs of the VCA and the high-pass filter, weighting and level sensing circuits coupled to the encoder output for sensing the level of the compressed analog audio signal. The encoder further includes a limiter circuit, coupled to the output of the weighting and level sensing circuits that produces a control-voltage which is applied to the VCA control input.

For background purposes and as indicative of the art to which the invention relates, reference may be made to the following remaining patents found in the search:

| U.S. Pat. No. | INVENTOR | ISSUED |
| --- | --- | --- |
| 5,410,751 | Yokoyama | 25 April 1995 |
| 5,226,178 | Eastmond et al | 6 July 1993 |
| 5,216,555 | Sieborger et al | 1 June 1993 |
| 5,185,806 | Dolby et al | 9 February 1993 |
| 4,868,891 | Ide et al | 19 September 1989 |
| 4,462,048 | Ross | 24 June 1984 |
| 4,306,202 | Schroder | 15 December 1981 |
| 4,169,219 | Beard | 25 September 1979 |
| 3,969,680 | Wermuth | 13 July 1976 |

DISCLOSURE OF THE INVENTION

The audio processor is designed to reduce noise levels of audio systems and to produce naturally dynamic, hot and clean master recordings. In its most basic design, the audio processor is comprised of two main circuits as shown in FIG. 1: a single-ended, limited compressor/expander circuit and an output circuit.

The compressor/expander circuit includes a channel A section and a channel B section wherein each of the sections comprise:

1. means for receiving an audio input from an audio source and thereafter producing a buffered audio signal,
2. a level-set potentiometer having means for receiving and setting the level of the buffered audio signal and producing a source audio signal,
3. an absolute value circuit having means for receiving and performing full-wave rectification of the source audio signal, and producing an absolute value signal,
4. a threshold set circuit having means for receiving the channel A absolute value signal and a channel B absolute value signal. The circuit also includes a means for adjusting the amplitude of these signals and for summing these signals to produce a summed absolute value signal,
5. a peak voltage detector having means for detecting the peak level of the summed absolute value signal add producing a d-c level control signal,
6. means for receiving and switching the summed absolute value signal and producing a compress or expand input which is applied to a high-level control circuit having means for producing a high level control signal,
7. means for receiving and switching the d-c level control signal and producing a compress expand signal, which is applied to a low-level control,
8. a summing circuit having means for summing the high-level and low-level control signals and producing an attenuator control signal, and
9. an electronic attenuator having means for increasing or decreasing the amplitude of the source audio signal relative to the attenuator control signal and producing a level processed audio signal.

The output circuit is comprised of a dynamic noise reduction (DNR) circuit that is applied the level processed audio signal. The DNR produces a processed audio signal which is applied through a level adjust potentiometer to a buffer circuit from where a channel A output audio signal is produced. The channel B output signal is produced and processed in a like manner as described for the channel A signal.

A single adjustment of the threshold adjust circuit sets the trip points for both the low level (downward) compressor/expander and the high level (peak) compressor/expander. The low level expander has an adjustable threshold that tracks the high level threshold adjustment. Likewise, a single adjustment sets the bandwidth of the DNR circuit. In the expansion mode, the two circuits complement each other. When the low level expander lowers the signal level, the source noise level is also reduced. The reduced signal results in earlier activation of the bandwidth control of the DNR circuit causing the DNR to reduce its bandwidth resulting in a further reduction of the noise level. The two circuits together can provide up to 16 dB of noise reduction which is 6 dB more than provided by conventional noise reduction circuits. The DNR also provides 10 dB of noise reduction in the compression mode, but the compressor offers no further noise reduction.

The compressor/expander circuit does not operate in the same manner as conventional compressor/expander circuits. Conventional compressor/expander circuits available to the recording industry simply provide a decrease/increase of the circuit gain below/above the threshold setting. This arrangement actually makes achieving a "natural" sounding recording a series of critical adjustments. An example of the criticality of conventional system adjust is as follows: assume it is desired to obtain a 5 dB increase in signal level for a 2 dB increase in signal level above the threshold setting. The expander gain must be set for +2.5 volts/volt. If the expander settings are correct, the desired effect would be achieved, but if the input signal rises just 1 dB higher than anticipated, the output would increase by 7.5 dB, a noticeable change in output level. Further, a recorder, set to handle the anticipated peak, will produce a detachable at the increased level.

The adjustments for the downward expander, if used, are not as critical; however, the majority of units employ a "noise gate" in place of the downward expander. This noise gate drops the signal to a greatly reduced level or to zero for signals below the threshold setting. Again the setting becomes critical, if it is too high, there will be a perceptible drop in signal level, if too low, the desired masking of noise is not achieved.

The inventive audio processor does not require "critical" adjustment of its threshold controls and consistently produces a natural compression/expansion of the signal. This is accomplished by using limited processing of the source signal. Both the high and low level signal gain changes, relative to the threshold settings, are limited to occur over a small change in input signal level and are also limited to a specific amount of change. The net effect is the signal achieves a new level, but further changes in the source level result in a one-to-one correspondence in the output level as illustrated in FIGS. 6 and 7.

As described supra, a conventional expander achieves a 7.5 dB increase with the gain set at 2.5 for a 3 dB increase in input signal level. The audio processor has a selectable change of 5 dB or 7 dB increase in output for a 2 dB increase which results in a net increase of 3 dB or 5 dB in source signal level above the threshold setting. Further input signal increases will result in a corresponding increase in output. Thus, in the standard operating mode with 3 dB of high level expansion selected, the input is 3 dB above the threshold setting (1 dB greater than anticipated), the output would be 2+1+3=6 dB. The change in output level due to the higher than anticipated input would probably not be perceived by the listener and recorder distortion, although present, is greatly reduced over that achieved with a conventional expander. The low level expander works in a similar manner. When the input drops to a level of approximately 10 to 25 dB below the high level threshold setting as selected by the operator, the low level or downward expander is activated. The next 5 dB decrease in signal level will result in approximately an 11 dB decrease in output signal level. Further decreases in input signal levels will result in a one-to-one corresponding decrease in output signal level. FIG. 6 shows the compression/expansion curves developed by the audio processor and FIG. 7 shows the processor and conventional expander/compressor curves. The curve has been developed by empirically testing many variations and was found to be the curve most preferred by the recording industry. However, the low and high thresholds can be adjusted by as much as 15 dB relative to each other and the amount of offset or gain variation of the peak signal is made to be variable to accommodate sound sources with different degrees of compression and noise levels.

In view of the above disclosure, it is the primary object of the invention to provide an audio processor that is particularly suited to enhance the audio of sound recordings typically used by commercial audio recording systems and theater sound systems.

In addition to the primary object of the invention it is also an object to produce an audio processor that:

- can be operated in combination with most current professional audio recording studios as well as for live sound and instrument processing,
- clarifies the human voice in high level background sound environments such as action movies and heavy metal rock music,
- is user friendly,
- is single ended thus, the signal is not encoded and then decoded as with a Dolby type system. Thus, the processor can be used with any audio source, and
- is cost effective from both a manufacturer and consumer points of view.

BRIEF DESCRIPTION OF THE DRAWINGS

FIG. 2 is a block diagram of an audio processor that is used in combination with an audio recording system in the record mode.

FIG. 3 is a block diagram of an audio processor that is used in combination with an audio recording system in the duplicator mode.

FIGS. 7A-7C depict an audio processor expander curve and an industry typical expander curve.

BEST MODE FOR CARRYING OUT THE INVENTION

Figure 1:
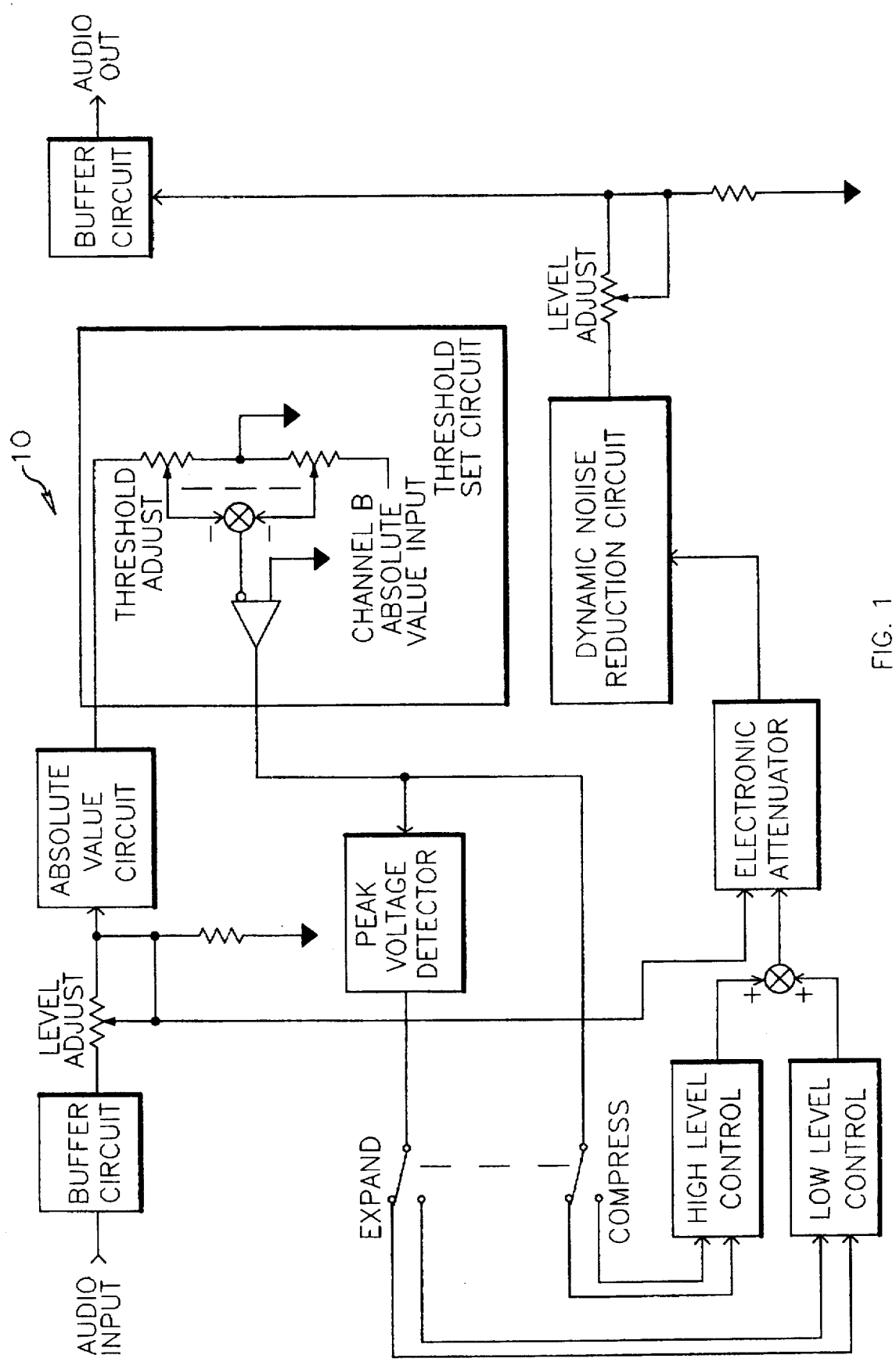
FIG. 1 is a simplified functional block diagram of the audio processor.
Figure 4:
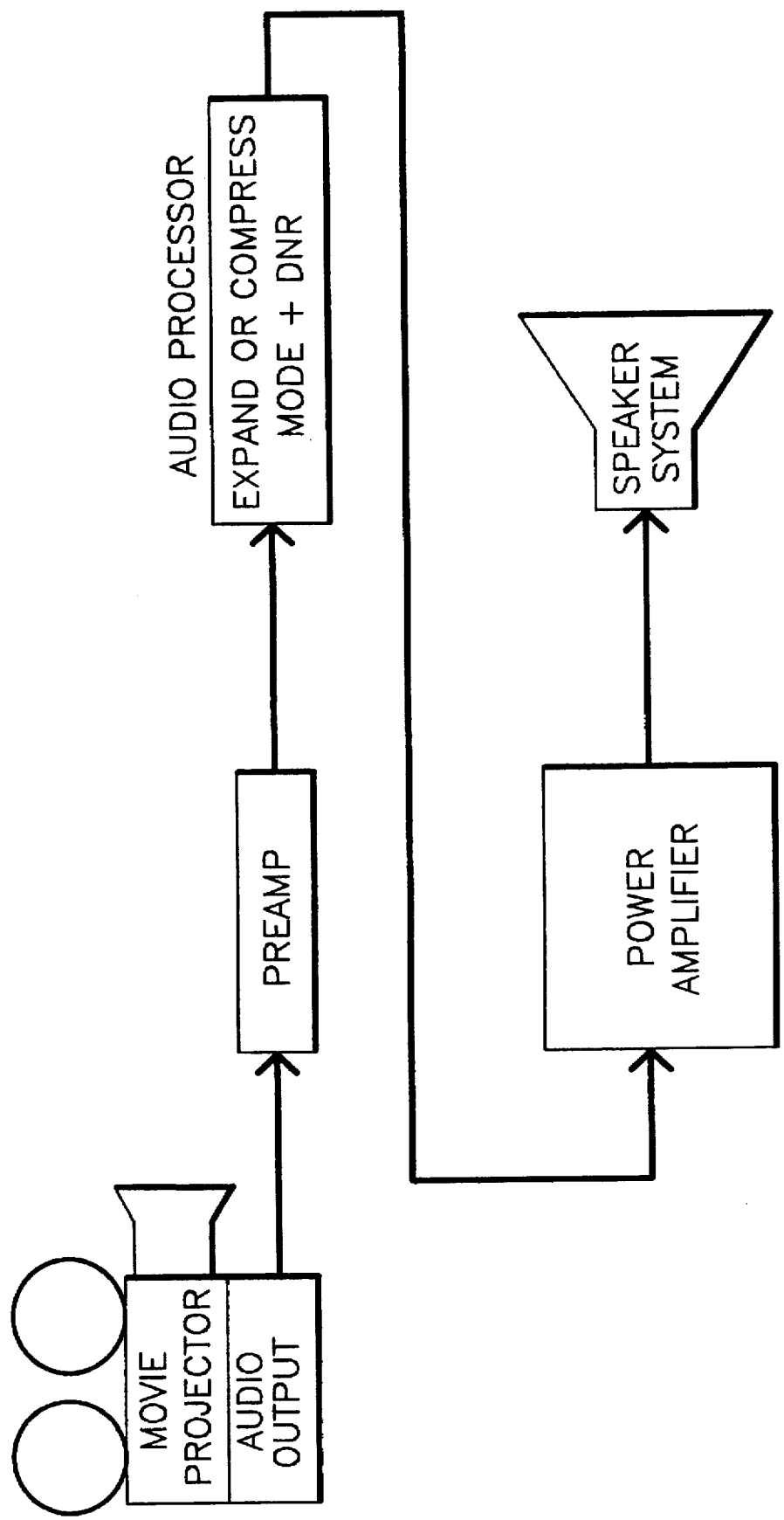
FIG. 4 is a block diagram of an audio processor that is used in combination with a movie theater sound system.

The best mode for carrying out the audio processor 10 is presented in terms of a preferred embodiment that is specifically designed to be included as a component of an audio recording system as shown in FIGS. 2 and 3 or as a component of a movie theater sound system as shown in FIG. 4. The preferred embodiment, as shown in FIGS. 5A-5D is comprised of two major circuits: a dual-level compressor/expander circuit 12 and an output circuit 205 that incorporates a dynamic noise reduction (DNR) circuit 206. The description of the audio processor 10 that follows is presented with switches and controls that are positioned to allow the processor to operate as an expander. When these switches and controls are placed in their alternate position, the processor 10 functions as a compressor. The audio processor is designed to operate with two channels: channel A and channel B. However, for clarity of description, only channel A of the audio processor circuit is included in FIGS. 5A-5C.

The dual-level compressor/expander circuit 12, is comprised of the following major elements: a first unity gain, non-inverting amplifier 13, an electronic potentiometer circuit 14, a level-set potentiometer 34, an absolute value circuit 60, a threshold set circuit 70, a threshold display drive circuit 100, a switch-hitter circuit 110, a peak voltage detecotr 151, a voltage comparator circuit 164, and an electronic attenuator 200.

Figure 5A:
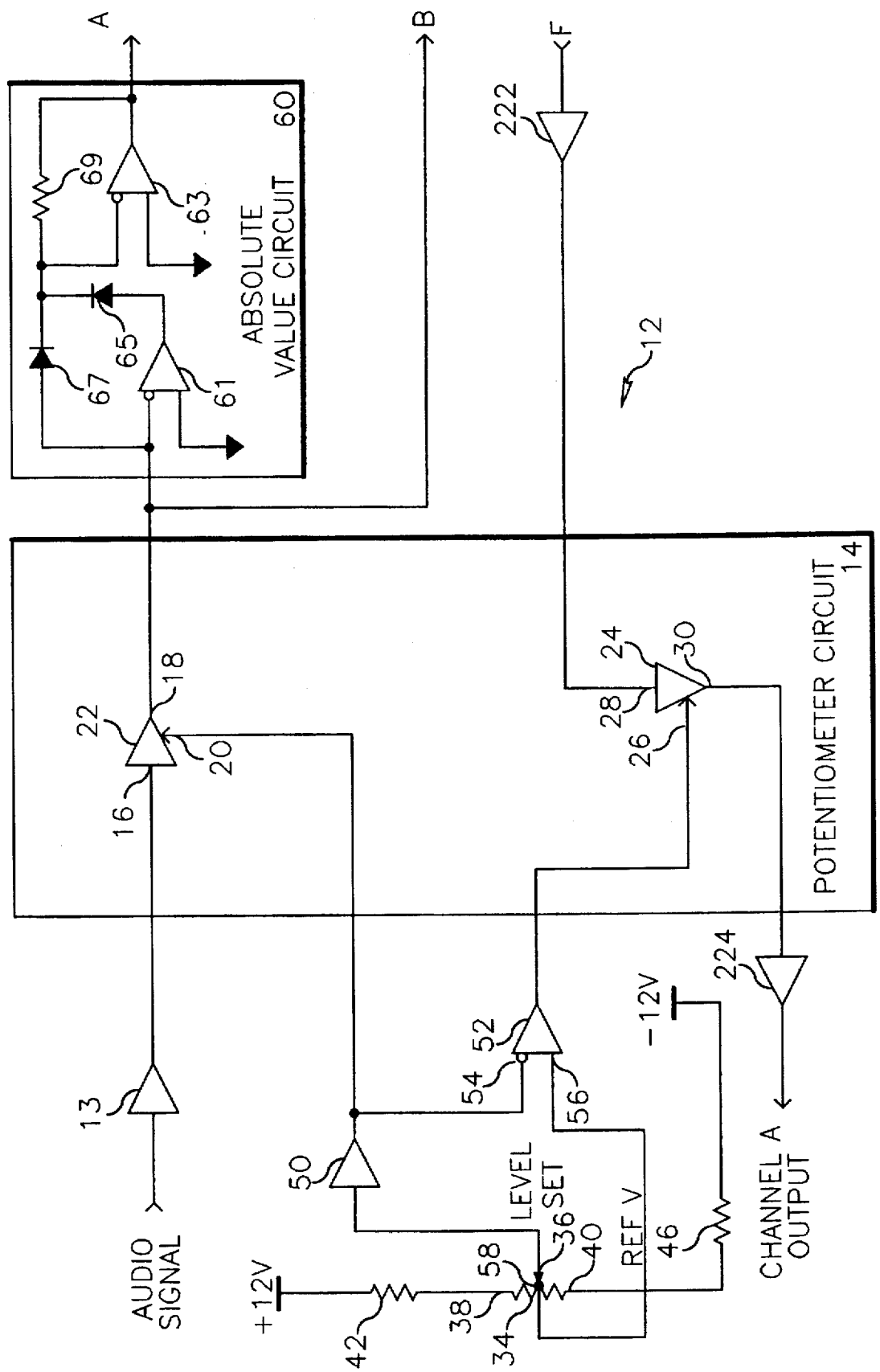
FIGS. 5A-5D is a schematic diagram of the channel A section of the audio processor.

The audio signal as shown in FIG. 5A, which can originate from any audio source, is applied to the first unity-gain, non-inverting amplifier 13. The output of the amplifier 13 is a first signal that is routed to the electronic potentiometer circuit 14 which consists of an input voltage controlled amplifier 22 having a gain control 20, an input 16 and an output and an output voltage controlled amplifier 24 having a gain control 26, an input 28 and an output 30. Preferably, the potentiometer circuit 14 consists of a dual, tandem electronic potentiometer—that is, a potentiometer that consists of four voltage controlled amplifiers that are controlled in pairs.

The input and output voltage controlled amplifiers 22,24 operate in combination with a level-set potentiometer 34, as shown in FIG. 5A, that bas a wiper 36, a first end 58 and a second end 40. The first end 38 is connected to a positive voltage, in this design +12 volts, through a first resistor 42. The second end 40 is connected to a negative voltage, in this design −12 volts through a second resistor 46. The output signal from the wiper of the level-set potentiometer 34 is a second signal that is applied through a second unity gain amplifier 50 that produces a third signal applied to the gain control 20 of the input voltage controlled amplifier 22. The output from the second unity gain amplifier 50 is also applied to an inverting input 54 on a difference amplifier 52 having a non-inverting input 56 that is applied a fourth signal from a center tap 58 on the level-set potentiometer 34. The difference amplifier 52 produces a fifth signal that is applied to the gain control 26 of the output voltage controlled amplifier 24. The input 28 and the output 30 of the output voltage controlled amplifier 24 are described infra.

Figure 5B:
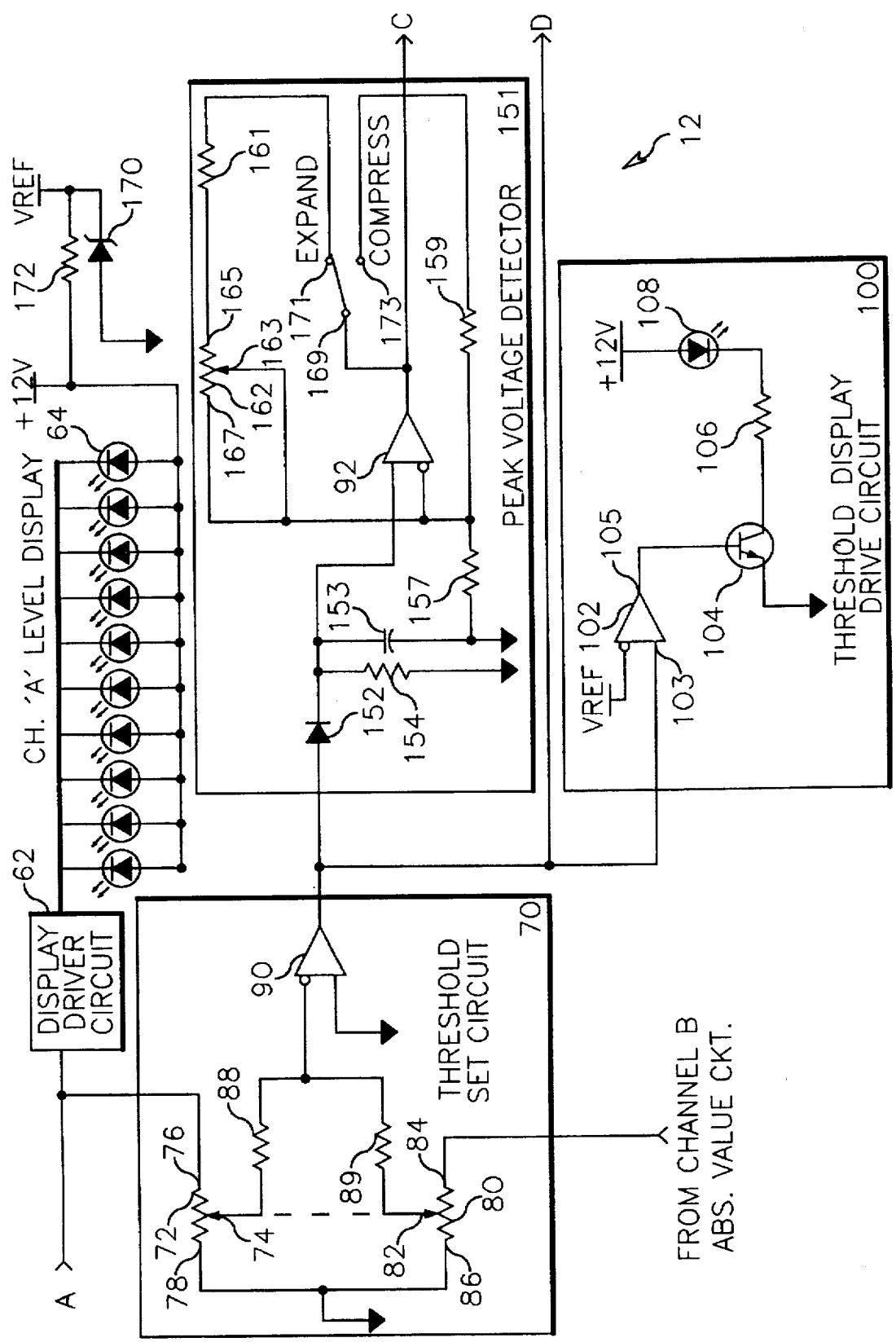

With an audio signal present, internal signal levels can be optimized by adjusting the level set potentiometer 34 while observing a ten segment LED display 64 as shown in FIG. 5B. The level set potentiometer allows ±6 dB of gain adjustment. Because the non-inverting input 56 to the difference amplifier 52 is biased at the nominal center value of the level-set potentiometer and the output of amplifier 50 is applied to the inverting input of amplifier 52, the output of amplifier 52 drives the gain control 26 of the output voltage controlled amplifier 24 and the output of amplifier 50 drives the gain control 20 of the voltage controlled amplifier 22. Each pair of the voltage controlled amplifiers are driven in equal, but opposite directions.

Figure 5C:
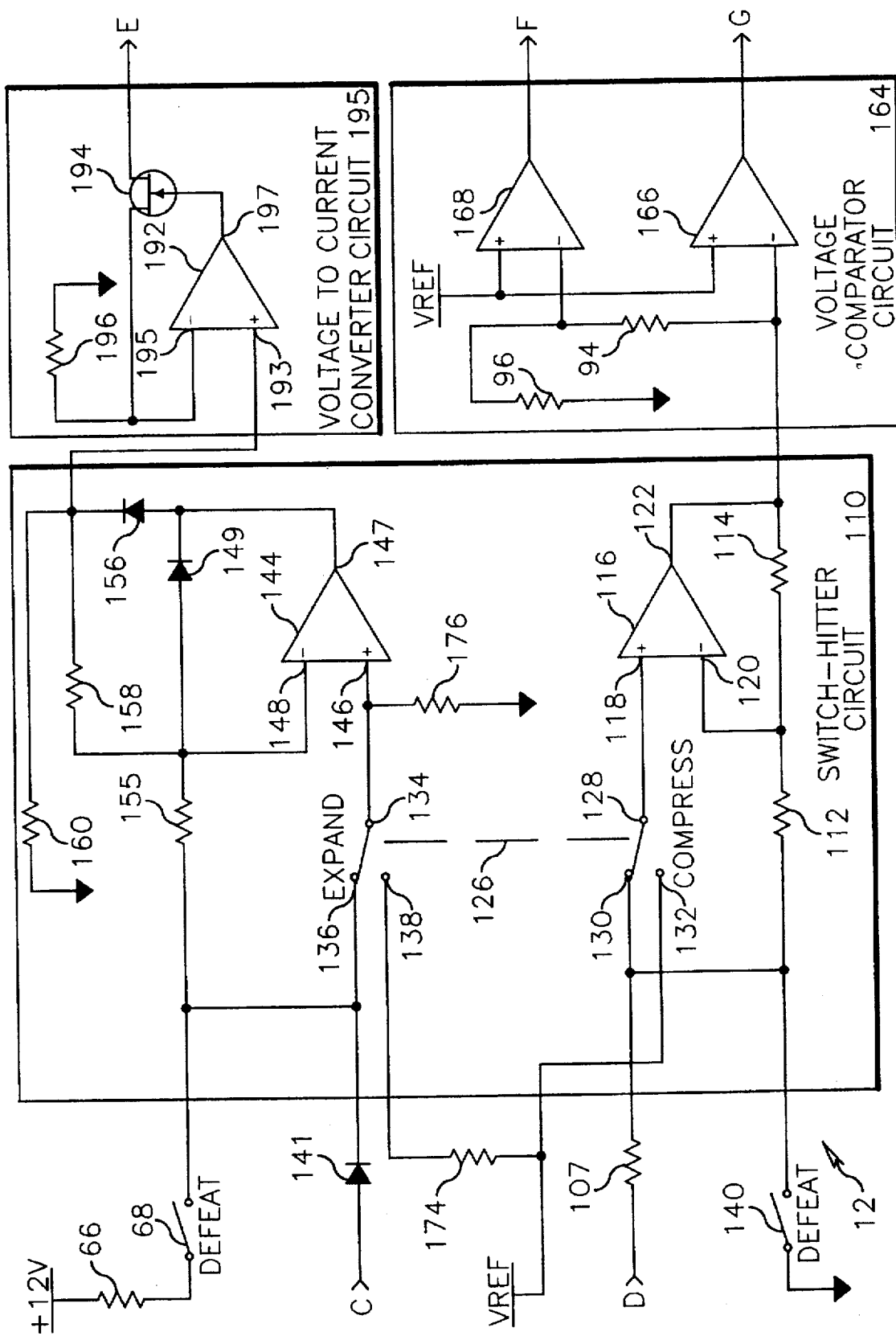
Figure 5D:
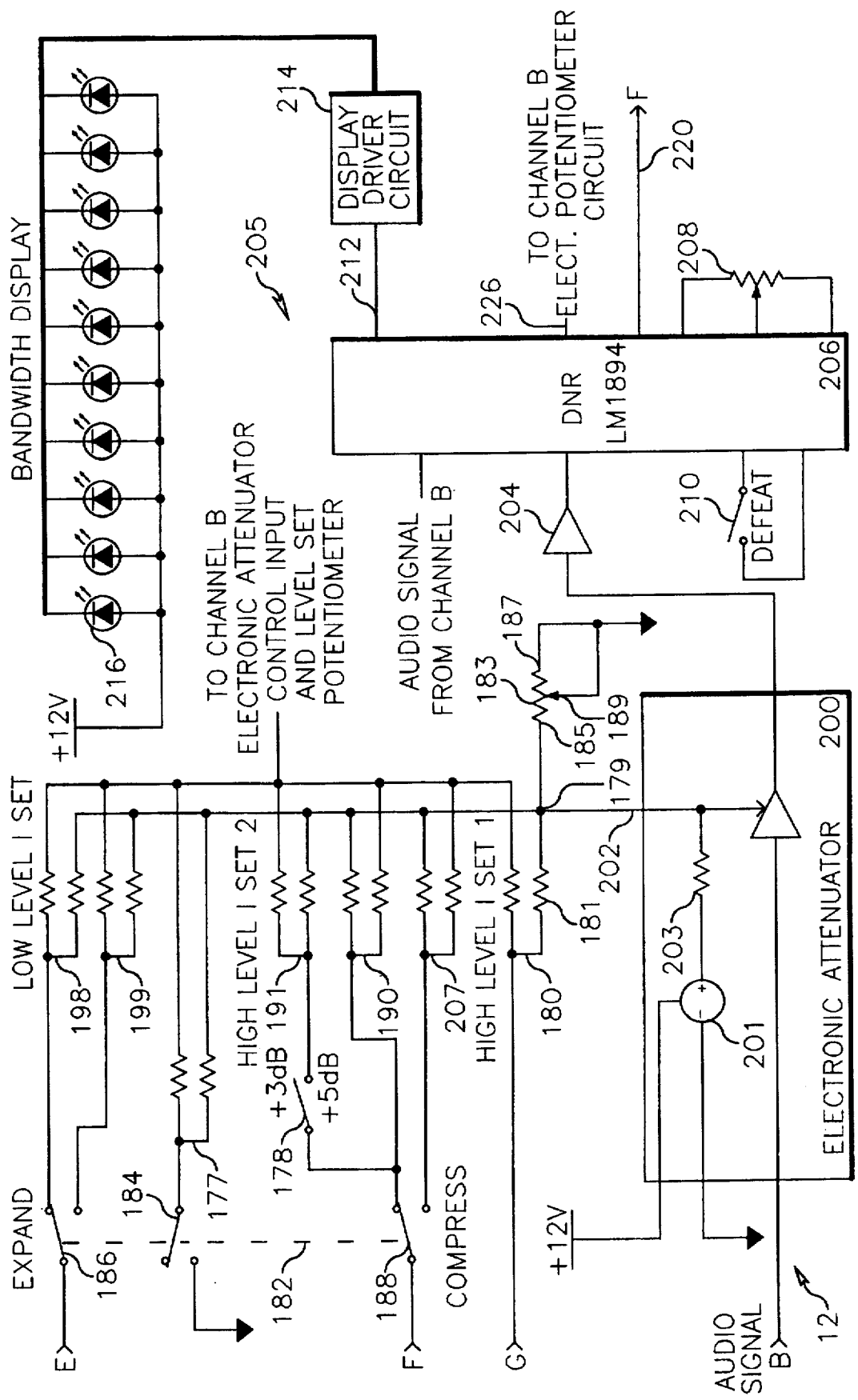

The output 18 from the input voltage controlled amplifier 22 is a sixth signal applied to an absolute value circuit 60 as shown in FIG. 5A, and to an electronic attenuator 200 as shown in FIG. 5D and as described infra. The absolute value circuit 60 creates a seventh signal equal to minus the absolute value of the audio signal. The seventh signal is applied to a display driver circuit 62 that drives an LED display 64 that displays the internal signal level and to a threshold adjust circuit 70.

The threshold adjust circuit 70 as shown in FIG. 5B, is comprised of a first threshold potentiometer 72 having a wiper 74, a first end 76 and a second end 78; and a second threshold potentimeter 80 having a wiper 82, a first end 84 and a second end 86. The output of the channel A absolute value circuit 70 is applied to the first end 76 of the first threshold potentiometer 72. Likewise, an output from a channel B absolute value circuit (not shown) is applied to the first end 84 of the second threshold potentiometer 80. The second end 78 of the first threshold potentiometer 72 is connected to the second end 86 of the second threshold potentiometer 80 and both are connected to a junction that is connected to circuit ground.

The output of the threshold potentiometers 72,80 is derived from each wiper 74,82. Wiper 74 is connected to the first end of a fourth resistor 88. The wiper 82 is connected to the first end of a fifth resistor 89. The second and of resistor 88 is connected to the second end of resistor 89 and subsequently connected to the inverting input of the first summing amplifier 90. The summing amplifier produces an eighth signal that is routed to the peak detector circuit 151, the threshold display circuit 100 and to the first end of a twelfth resistor 107.

The peak detector circuit 151 is comprised of a third diode 152, a sixth resistor 154, a capacitor 153, a first non-inverting gain amplifier 92, a seventh resistor 157, a eighth resistor 159, a ninth resistor 161, a low level threshold potentiometer 162 having a first and 165, a second and 167 and a wiper 163, and a single-pole single-throw switch 169.

The eighth signal is applied to the anode of the first diode 152. The cathode of the first diode 152 is connected to the first and of a sixth resistor 154, the first and of a capacitor 153 and the non-inverting input to a first non-inverting gain amplifier 92. The second and of resistor 154 and the second and of capacitor 153 are connected to circuit ground. The output of amplifier 72 is connected to the pole of the expand compress switch 167. The first contact 171 of switch 169 is connected to the first end of a ninth resistor 161. The second end of resistor 161 is connected to the first end 165 of potentiometer 162. The wiper 163 is connected to the second end 167 of potentiometer 162 and to the first end of a seventh resistor 157 and to the inverting input of amplifier 92 and to the first and of resistor 159. The second end of resistor 157 is connected to circuit ground. The second contact 173 of switch 169 is connected to the second end of resistor 159.

The gain of the peak detector circuit with switch 169 in the expand position is as follows: Vo/Vi=1+(ninth resistor+ position of potentiometer 162)/seventh resistor. The gain of the peak detector circuit, with switch 169 in the compress position, is as follows: Vo/Vi=1+eighth resistor/seventh resistor which is the same as the gain in the expand position with the potentiometer wiper 163 placed at the first end 165 of the low level threshold set potentiometer 162.

Potentiometer 162 allows the low level threshold to be varied from VREF–10 dB to VREF–25 dB when in the expand mode. The output of amplifier 92 is a ninth signal which is a d-c level proportional to the peak value of the eight signal. In normal operation, the voltage developed across the peak detector capacitor 153 follows the average peak value of the eighth signal. However, should a nominal eighth signal suddenly drop to a level equal to or less than 30 dB below VREF, full reduction of the output of the peak detector circuit 151 is delayed by 60 milliseconds by a time constant created by capacitor 155 and the sixth resistor 154. This delay prevents a "breathing" effect frequently noticed in many compressor/expander circuits.

The threshold display drive circuit 100 is comprised of a display drive amplifier 102 having an input 103 that is applied the high-level control eighth signal from the summing amplifier 90 located in the threshold set circuit 70. The display drive amplifier 102 is connected to a display drive transistor 104 that is connected to a threshold display LED 108 through a current limiting tenth resistor 106. The display drive transistor 104 is enabled when the eighth signal from amplifier 90 reaches the VREF level at which time amplifier 102 output goes positive turning on transistor 104 causing the LED to illuminate indicating that the high level signal has reached the VREF level indicating the threshold setting. The first threshold potentiometer 72 is adjusted so that the LED illuminates only during peak levels of the audio signal.

The switch hitter circuit 110 as shown in FIG. 5C is comprised of a sixteenth resistor 112, a seventeenth resistor 114, a first switch-hitter amplifier 116 having a non-inverting input 118, a inverting input 120, and a output 122. The switch hitter circuit is further comprised of a fifteenth resistor 176, an eighteenth resistor 155, a nineteenth resistor 158, a twentieth resistor 160, a fourth diode 156; a fifth diode 149, a double-pole double-throw switch 126 having a first pole 128, a first contact 130, a second contact 132, a second pole 134, a third contact 136 and a fourth contact 138, a second switch hitter amplifier 144 having an inverting input 148, a non-inverting input 146 and a output 147.

The eighth signal is applied to the first end of a twelfth resistor 107. The second end of resistor is connected to the first contact 130 of a double-throw double-throw switch 126, the contact of a single pole single-throw switch 140 and to the first end of a sixteenth resistor 112. The first pole 128 of switch 126 is connected to the non-inverting input 118 of first switch hitter amplifier 116.

With switch 126 in the expand position, the eighth signal is applied to through resistor 107 and first pole 128 of switch 126 to the non-inverting input of amplifier 116. The eighth signal is also applied to the inverting input 120 of amplifier 116 through the sixteenth resistor 112. The gain of the circuit is: Vo/Vi=−seventeenth resistor/sixteenth resistor+ seventeenth resistor/sixteenth resistor)=+1 for sixteenth resistor=seventeenth resistor.

The pole of switch 140 is connected to circuit ground closing switch 140 defeats the circuit by grounding the input signal. Resistor 107 prevents grounding the eighth signal at its source.

The ninth signal is applied to the anode of a sixth diode 141. The cathode of the sixth diode 141 is connected to the third contact 136 of double-throw double-throw switch 126, the first end of a eighteenth resistor 155 and the contact 71 of a single pole single-throw switch 68. The second end of the eighteenth resistor 155 is connected to the first end of resistor 158, the anode of a fifth diode 149 and the inverting input 148 of amplifier 144. The non-inverting input 146 is connected to the second pole 134 of switch 126 and the first end of resistor 176. The second end of resistor 176 is connected to circuit ground. The output 147 of amplifier 144 is connected to the cathode of the fifth diode and the anode of a fourth diode. The cathode of the fourth diode is connected to the first end of resistor 158 and to the first end of resistor 160. The second end of resistor 160 is connected to circuit ground.

The junction of resistors 158,160 and the cathode of diode 156 is the source of the eleventh signal. With switch 126 in the expand position, the ninth signal is applied via diode 141 to both the non-inverting input 146 and through a eighteenth resistor 155 to the inverting input 148 of amplifier 144. The gain of the circuit is the eleventh signal equal to: Vout/Vin= −nineteenth R/eighteenth R+(1+nineteenth R/eighteenth R)=+1 for eighteenth R=nineteenth R.

The pole of switch 68 is connected the first end of resistor 66 and the second end of resistor 66 is connected to 12 volts closing switch 68 defeats the operation of the circuit as follows: the voltage applied to the first end of eighteenth resistor 155 and to the non-inverting input 146 of amplifier 144 is developed by resistor 176 and is equal to: 12 volts o fifteenth resistor/(fifteenth resistor+thirteenth resistor). The value of the thirteenth resistor is much less than the value of the fifteenth resistor causing the voltage developed by the resistor/divider network to be of sufficient magnitude to cause the output 147 of amplifier 144 to approach the positive voltage rail.

The high anti low level switch hitter expander circuits are converted to high and low level compressor circuits by placing the double-pole, double-throw expand/compress switch 126 in the alternate position opposite that shown in FIG. 5C. Placing the switch 126 in the COMPRESS position causes VREF to be applied through contact 132 to the non-inverting positive input 118 of the high-level switch-hitter first amplifier 116, and a positive voltage to be applied through contact 138 to the non-inverting positive input 146 of low level switch-hitter second amplifier 144.

The positive voltage created at the fourth contact of the double-pole, double-throw switch 126, is developed by resistor divider network created when switch 136 is placed in the compress position and consists of the fourteenth and fifteenth resistors 174,176 and is equal to 25 dB below VREF times the gains of summing amplifier 90 and peak detector amplifier 92. Sourcing these voltages to the switch-hitter first amplifier 116 and second amplifier 144 results in the switch hitter first amplifier 116 being held at +2×VREF and the eleventh signal present at the junction of resistors 158,160 and the cathode of diode 156 to be held at a level effectively equal to 2×(25 dB below VREF) with no other signal present.

The inputs to both the first and second switch-hitter amplifiers 116,144 are now only applied to the inverting inputs which results in the input voltages to be subtracted from the voltage levels established at the output of the amplifiers. When the basic signal rises to a level equal to 25 dB below VREF the output eleventh signal developed by switch-hitter amplifier 144 is the same as it was in the expander mode with an input corresponding to 25 dB below VREF. Further increases in input level results in a corresponding decrease in the output of the low level expander. The circuit can be defeated, as done in the expansion mode, by closing switch 68 causing the switch-hitter amplifier to be driven to its negative rail. The fourth diode 156 prevents the output of the circuit from going negative. The eighth resistor 160 holds the circuit output ground potential when the output of the switch-hitter amplifier 192 goes negative. Diode 149 keeps the loop around amplifier 192 closed when the amplifier output is negative.

When the eighth signal reaches the VREF levels, the output 122 of amplifier 116 is the same as it was in the expand mode with the eighth signal equal to VREF. Further increases in the level of the eight signal results in decreasing the output 122 of amplifier 116 to fall below the VREF level. The circuit can be defeated, as done in the expansion mode, by closing switch 140 grounding the input. The output 122 of amplifier 116 is held at the 2+VREF level with switch 140 closed.

The output 122 of the first switch hitter amplifier 116 is a tenth signal that is applied to a voltage comparator circuit 164. The voltage comparator circuit 164 consists of a first voltage comparator 166 and a second voltage comparator 168 that each have their positive input connected to VREF and where negative inputs are applied the tenth signal from the first switch hitter amplifier 116. The first voltage comparator 166 is set to trip at a reference voltage VREF which is set by a zener diode 170 and a current limiting tenth resistor 172. The second comparator 168 is biased to trip at 2 dB higher than VREF by a resistor divider network consisting of an twenty-second resistor 94 and a twenty-third resistor 96. There are no filters in this circuit path. Therefore, the comparators will trip on any voltage level of the high-level signal that exceeds VREF independent of the frequency or duration of the signal. The voltage comparators have open collector outputs which are floating when the comparators are not tripped and at near circuit ground potential when the comparators are tipped. The sum of the outputs F add G of the voltage comparator circuit 164, as shown in FIG. 5C, is the high level signal. This signal is developed by sinking current through the resistor networks 191, 190, 207, 180 and 181 as shown in FIG. 5D.

The output of the low level switch hitter circuit is an eleventh signal developed at the junction of resistors 158, 160 and the cathode of diode 156 by amplifier 144 and is applied to a voltage to current converter circuit 195. The voltage to current converter circuit consists of an amplifier 192 having an inverting input 195, a non-inverting input 193 and a output 197, a JFET transistor and a twenty-first resistor 196. The eleventh signal is applied to the non-inverting input 193 of amplifier 192. The output 197 of amplifier 192 is applied to the gate of transistor 194. The source of transistor 194 is connected to the first end of a twenty-first resistor 196 and to the inverting input 195 of amplifier 192. The second end of resistor 196 is connected to circuit ground. The circuit output E at the drain of transistor 194, as shown in FIG. 5C is a current sink equal to I sink=Vin/twenty-first resistor. From this point, the low level signal is developed by sinking current through the low level set resistors 198,197 as shown in FIG. 5D.

The electronic attenuator 200 is an integrated circuit (IC) that has a nominal peak gain of 12 dB and a maximum gain attenuation of 80 dB. The audio processor application of this IC uses only the top 12 dB of the ICs attenuation range. The electronic attenuator 200 contains an internal voltage source 201 and an internal source resistor 203 that has a first end connected to the internal voltage source and a second end connected to the electronic attenuator control input 202. External resistors with one end connected to the control input and the other end connected to circuit ground or current sink circuitry develop a voltage divider network with the attenuator's internal resistor and the voltage developed by the resistor divider network at the control input is a fifteenth signal that establishes the sixteenth signal output level of the electronic attenuator. Performance of the electronic attenuator as a voltage controlled volume control is critical in the development of the audio processor compressor/expansion curves shown in FIGS. 6 and 7.

The level I set resistor network shown in FIG. 5D consists of seven pairs of resistors, one resistor of each pair is connected to the channel A electronic attenuator 200 control input 202 and the other resistor of each pair is connected to the channel B electronic attenuator control input (not shown). These resistors, when connected to circuit ground by the voltage comparators 166,168 or the third pole 184 of switch 182 or have the current varied through them by the voltage to current converter circuit 195 to cause the voltage at the control input 202 of the electronic attenuator to be varied and subsequently vary the electronic attenuator's output. A potentiometer 183 with its first end 185 connected to the junction 179 of the fourteenth level I set resistor 181 and the electronic attenuator control input 202 and with its second end 187 and wiper 189 connected to circuit ground sets the nominal gain of the electronic attenuator. A potentiometer (not shown) connected in a similar manner sets the channel B electronic potentiometer's nominal gain.

The output of the first voltage comparator 166 is a twelfth signal that is applied through the high level I set 1 resistors 180 to the control input 202 of the channel A electronic attenuator 200 and to the control input of the channel B electronic attenuator (not shown). The high level I set 1 180 resistors are sized to provide 1 dB command authority to the electronic attenuator.

The high level I set 2 resistor network consists of two pairs of resistors 190,191 with one resistor of each pair connected to the control input 202 of the channel A electronic attenuator and the other resistor of each pair connected to the control input of the channel B electronic attenuator (not shown). With switches 178 and 182 in the positions shown in FIG. 5D, a thirteenth signal which is a output of the second voltage comparator 168 is applied through the first pole 188 of a triple pole double-throw expand/compress switch 182 to the first pair of high level I set 2 resistor networks 190 that is connected to the control inputs of the electronic attenuators. The resistors of the first high level I set 2 network 190 are sized to provide 2 dB command authority to the electronic attenuators.

Placing the single pole single-throw switch 178 in the position opposite that shown in FIG. 5D causes the second set of high level I set 2 resistors 191 to be placed in parallel with the first set of high level I set 2 resistors 190 effectively reducing the resistance of the high level I set 2 resistors network. With switch 178 closed the high level I set 2 resistor network has 5 dB of command authority to the electronic attenuators.

The output of the voltage to current converter circuit 195 is a fourteenth signal which is applied through the second pole 186 of a double pole double-throw expand compress switch 184 to a low level I set resistor network 198. One resistor of the low level I set resistor network 198 is connected to the control input 202 of the channel A electronic attenuator 200 and the other resistor of the low level I set resistor network 198 is connected to the control input of the channel B electronic attenuator. The low level I set resistor network 198 has 6 dB of command authority to the electronic attenuator when the voltage to current converter 195 is sinking its maximum current.

The output of the level I set resistor networks is a fifteenth signal which provides the signal to the electronic attenuator.

With the switches in FIGS. 5B, 5C and 5D in the positions shown and the wiper 163 of the low level threshold set potentiometer 162 in FIG. 5B placed to the second end 167 of the potentiometer and one time calibration having been performed such that with an 1000 Hz signal with a level less than or equal to VREF−30 dB present at the output 18 of the input voltage controlled amplifier 22 as shown in FIG. 5A, potentiometer 183 is adjusted to oblation an output of the electronic attenuator FIG. 5D equal to the level observed at the output 18 of voltage controlled amplifier 22; setup of the circuit is as follows: with an audio signal with a nominal level equal to VREF±6 dB present at the input to the first unity gain amplifier 13 shown in FIG. 5A, the level set potentiometer 34 is adjusted such that the peak excursions of the audio signal cause the sixth to eighth LED on the level display 64 shown in FIG. 5B to illuminate. This causes the internal voltage levels of the circuitry to be of a optimum level ±3 dB to achieve ideal circuit performance. The threshold adjust potentiometers 72,80 are now adjusted such that the threshold display LED 108 just illuminates during the audio signal peaks.

The expand circuit will now operate as follows: with an audio signal with an amplitude at the output of the input voltage controlled amplifier 22, equal to or less than VREF−30 dB the voltage to current converter 195 is essentially off, both voltage comparators 166,168 are off and thus no current is being drawn through any of the level I set resistors shown in FIG. 5D. Potentiometer 183 has been previously adjusted such that the control voltage developed by the resistor divider network consisting the electronic attenautors 200 internal source resistor 203 and the setting of potentiometer 183 causes the gain of the electronic attenuator 200 to be 0 dB and thus the signal level at the output of the electronic attenuator 200 will equal the sixth signal level at the output 18 of the input voltage controlled amplifier 22.

As the sixth signal increases to a level greater than VREF−30 dB, the voltage to current converter starts to conduct drawing current through the low level I set resistors 198 causing the control voltage developed by the resistor divider network consisting of the electronic attenuators 200 internal source resistor 203 and the calibration potentiometer 183 in parallel with the equivalent low level I set resistor 198 value to be reduced. This will cause the gain of the electronic attenuator to increase non linearly until the sixth signal reaches a level equal to VREF−25 dB. At that level, the voltage to current converter circuit 195 will be in saturation providing no further increases in the current drawn through the low level I set resistors 198. The output of the electronic attenuator will now equal the sixth signal level +6 dB which is the nominal output level.

No further changes will occur in the electronic attenuator's 200 gain until the sixth signal VREF. When the sixth signal reaches a level between VREF and VREF−1 dB, the voltage comparator 166 will trip causing the high level I set 1 resistors 180 to be in parallel with the low level I set 1 resistors 198 and the calibration potentiometer 183 which causes the electronic attenuator 200 control voltage at junction 182 to be further reduced. The output of the electronic attenuator 200 will now equal the sixth signal +7 dB. Any further increases in the sixth signal level will cause comparator 168 to trip causing the high level I set 2 resistors 190 to be in parallel with the high level I set 1 resistors 180 and the low level I set resistors 198 and the calibration potentiometer 183 which causes the voltage at junction 177 to be further reduced. The output of the electronic attenuator 200 will now be equal to the level of the sixth signal +9 dB. Further increases in the sixth signal level will not result in any further gain change commands to the electronic attenuator. The two stage drive plus the small amount of smoothing inherent to the attenuator results in a smooth transition to an output signal level that is increased by 3 dB.

The expand mode allows the user to make two additional adjustments to tailor the processor to correct for some unique audio source deficiencies. the normal expansion mode expands the high level signal by 3 dB and the low level threshold should be set to occur at VREF−20/25 dB. Some heavy metal and rap music recordings have very slight differences between the music and vocal levels. These types of music can occasionally benefit from increasing the high level expansion to 5 dB. this is accomplished by closing switch 178 as described previously herein. The 5 dB expand position should not be used with instrumental, easy listening vocals, opera, etc. as the listener will perceive the level change when the high level expander is operating.

Raising the low level threshold above the normal VREF 20/25 dB level by adjusting the position of potentiometer 162 in FIG. 5B can improve the signal to noise ratio of spoken word and some rap recordings.

Again if the low level threshold is placed too high during the recording of most instrumentals, easy listening vocals, jazz, blues or opera music, the listener will perceive the drop in audio level when the signal level drops below the low level threshold.

In the normal expansion mode the electronic attenuator transitions from a gain of 0 dB for audio signal levels less than VREF−30 dB to +6 dB for audio signal levels between VREF−25 dB and VREF and +9 dB for audio signal levels above VREF+2 dB. When placed in the compression mode, the electronic attenuator transitions from a gain of +12 dB for audio signal levels less than VREF–30 dB to +6 dB for audio signal levels between VREF–25 dB and VREF–3 dB and to +3 dB for audio signals equal to or greater than VREF. The different offsets and gains between the expansion and compression modes for similar audio signal levels is accomplished by reconfiguring the level I set resistor network. When the compression mode is selected switch 182 is placed in the position opposite of that shown in FIG. 5D.

With switch 169 in FIG. 5B, switch 126 in FIG. 5C and switch 182 in FIG. 5D placed in the position opposite of that shown in the respective figures, the audio processor is reconfigured from an expander to a compressor circuit. Operation of the processor in the compression mode is as follows: as detailed earlier herein, the switch hitter amplifiers 116 and 144 are configured as inverting amplifiers and biased such that their outputs 122,147 are at a maximum with no audio signal present.

In the expansion mode when the switch hitter amplifier outputs 122,147 were at a minimum causing the voltage to current converter circuit 195 output to be essentially off and neither voltage comparator 166,168 is tripped, the gain of the electronic attenuator 200 was set at 0 dB by potentiometer 183. When the voltage to current converter output is off and the comparators are not tripped in the compression mode the gain of the electronic attenuator 200 is required to be at +3 dB. This gain increase is accomplished by connecting level I set resistors 177 to circuit ground via the third pole 184 of triple pole double-throw switch 182 when the switch is placed in the position opposite that shown in FIG. 5D. The level I set resistors 177 are sized such that the resistor divider network consisting of the electronic attenuator internal source resistor 203 and the level I set resistor 177 in parallel with the calibration potentiometer 183 reduces the voltage at the electronic attenuator command input 202 sufficiently enough to cause the electronic attenuators gain to increase by 3 dB.

When the audio signal decreases to a level slightly less then VREF, the output 122 of switch hitter amplifier 116 increases to slightly above VREF causing comparator 166 to trip placing the high level I set 1 resistors 180 in parallel with the level I set resistors 177 and the calibration potentiometers. The resulting reduction of the voltage at the command input 202 of the electronic attenuator 200 causes the attenuator output to increase by 1¾ dB to 4 ¾ dB. The high level I set 1 resistors had 1 dB of authority when in the expand mode but as the equivalent parallel equivalent resistance has now been changed, these resistors have the greater authority of 1¾ dB. A further reduction of the audio signal to a level slightly less than VREF–2 dB results in the output 122 of switch hitter amplifier 116 to exceed VREF+2 dB causing comparator 168 to trip. This results in the high level I set 2 resistors 190 to be placed in parallel with the high level I set 1 resistors, the level set resistors 177 and the channel A calibration potentiometer 183. The high level I set 2 resistors 190 are sized to provide 1¼ dB of authority and the output of the electronic attenuator 200 will now be increase to +6 dB.

No further changes in the electronic attenuators gain will occur until the audio signal level drops to a level equal to VREF–25 dB. At that level, the output 147 of the second switch hitter amplifier 144 is the same as it was in expand mode with an audio signal equal to VREF–25 dB. Further decreases in the audio signal level will result in a proportional increase in the output 147 of switch hitter amplifier 144 causing the voltage to current converter 195 sink current through the low level I set resistors 199. Maximum current sink is achieved when the audio signal reaches a level equal to VREF–30 dS. The low level I set resistors are sized to provide 6 dB of gain authority when the voltage to current converter is sinking its maximum current. The output of the electronic attenuator will now be increased to +12 dB. Also, the threshold display LED 108 does not illuminate until the circuit is in full –3 dB compression.

The output sixteenth signal from the electronic attenuator 200, is applied through a non-inverting amplifier 204 having a gain of –6 dB which re-establishes the nominal audio signal level sourced from the input electronic potentiometer 22 shown in FIG. 5A.

Figure 6:
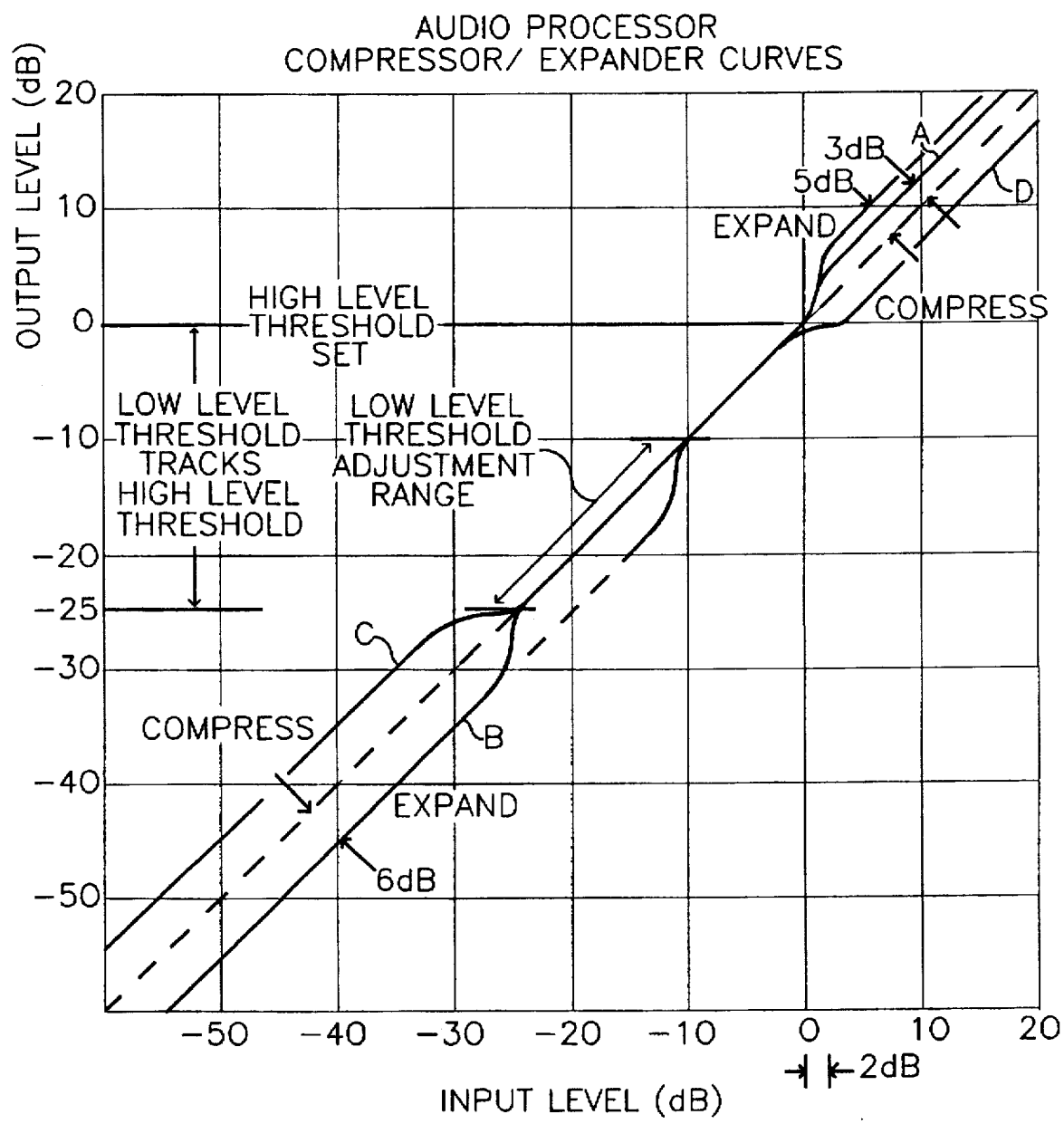
FIG. 6 is an audio processor compressor/expander curve.

The audio signal levels obtained at the output of amplifier 204 are shown in FIG. 6. Curve A portrays the high level expansion and curve B portrays the low level expansion produced by the audio processor. FIG. 7 provides a detailed view of the expansion curve level transitions and compares the audio processor expansion curves to typical expansion curves produced by the recording industry standard expander circuits.

The output of amplifier 204, is applied to an output circuit 205 that incorporates a Dynamic Noise Reduction (DNR) circuit 206 implemented as required by license agreement with National Semiconductor Corporation under U.S. Pat. Nos. 3,678,416 and 3,783,159. The reduction of the low level audio signal by the expander circuit results in earlier actuation of the DNR and thus appears to improve the performance of the DNR.

The DNR circuit 206 includes a DNR bandwidth adjust potentiometer 208, and a single-pole, single-throw switch 210 that when closed, defeats the DNR circuit. The DNR has three outputs. The first output 212 is applied to a display driver circuit 214 which drives a ten segment LED 216 that displays the DNR bandwidth. The second DNR output 220 drives a first unity-gain, non-inverting amplifier 222 having an output that is applied to the input 28 of the output voltage controlled amplifier 24. The output from second end 30 of the output voltage controlled amplifier 24 is applied through a second unity-gain amplifier 224 that provides the channel A audio output. The voltage controlled amplifier 24 is driven in the opposite direction of the audio signal input voltage controlled amplifier 22. This re-establishes the nominal audio signal level originally applied to the compressor or expander circuits. The third DNR output 226 is the channel B output which is applied and processed in a similar manner as described supra.

While the invention has been described in complete detail and pictorially shown in the accompanying drawings it is not to be limited to such details, since many changes and modifications may be made to the invention without departing from the spirit and the scope thereof. Hence, it is described to cover any and all modifications and forms which may come within the language and scope of the claims.

I claim:
1. An audio processor comprising:
 a) a single-ended, limited compressor/expander circuit designed to produce compression or expansion of an audio signal, wherein the compression or expansion is created by offsetting the audio signal to a new level, said circuit having a channel A section and a channel B section wherein each said section comprises:
  (1) means for receiving the audio signal from an audio source and producing a buffered audio signal,
  (2) a level-set potentiometer having means for receiving and setting the level of the buffered audio signal and producing a source audio signal,

(3) an absolute value circuit having means for receiving and performing full-wave rectification of the source audio signal, and producing an absolute value signal, (4) a threshold set circuit having means for receiving a channel A absolute value signal and a channel B absolute value signal and means for adjusting the amplitude of these signals and summing these signals to produce a summed absolute value signal, (5) a peak voltage detector having means for detecting the peak level of the summed absolute value signal and producing a d-c level signal, (6) means for receiving and switching the summed absolute value signal and producing a compress or expand input which is applied to a high-level control circuit having means for producing a high-level signal, (7) means for receiving and switching the d-c level signal and producing a compress or expand signal which is applied to a low-level control circuit having means fop producing a low-level signal, (8) a summing circuit having means for summing the high-level and low-level signals and producing an attenuator signal, (9) an electronic attenuator having means for increasing or the amplitude of the source audio signal relative to the attenuator signal and producing a level processed audio signal, and b) an output circuit comprising a dynamic noise reduction (DNR) circuit that is applied the level processed audio signal after which said DNR produces a processed audio signal which is applied through a level adjust potentiometer to a buffer circuit from where a channel A output audio signal is produced.

2. The audio processor as specified in claim 1 wherein said audio source comprises an audio tape, a compact disc, a synthesized sound or a natural or artificial sound.

3. The audio processor as specified in claim 1 wherein said level adjust potentiometer comprises an electronic potentiometer circuit connected across a d-c voltage source and produces a voltage level signal and a reference voltage level that are applied to a difference amplifier that produces a difference voltage level signal, wherein said electronic potentiometer circuit has an input voltage controlled amplifier and an output voltage controlled amplifier, wherein the control of said input voltage controlled amplifier is affected by the voltage level signal and the output voltage controlled amplifier is affected by the difference voltage level signal, wherein the amplitude of the buffered audio signal is increased or decreased by the input voltage controlled amplifier to produce the source audio signal.

4. The audio processor as specified in claim 1 wherein said means for receiving the channel A and channel B absolute value signals comprises a first threshold potentiometer that is applied the channel A absolute value signal and a series connected second threshold potentiometer that is applied a channel B absolute value signal from a channel B absolute value circuit, wherein the wipers of said first and second threshold potentiometers are summed and applied through an amplifier from where the summed absolute value signal is produced.

5. The audio processor as specified in claim 1 further comprising display driver that drives an LED display that indicates the internal signal level of said processor, wherein the absolute value signal is the source for said display driver.

6. The audio processor as specified in claim 1 further comprising a display driver that is applied the summed absolute value signal and indicates when the summed absolute value signal exceeds a reference voltage indicating the threshold setting.

7. The audio processor as specified in claim 1 wherein said peak voltage detector develops a d-c level proportional to the peak amplitude of the summed absolute value signal to produce the low-level signal.

8. The audio processor as specified in claim 1 wherein said means for receiving and switching the summed absolute value signal and the d-c level signal comprises a double-pole, double-throw switch that determines the compressor/expander function, wherein the first said switch is applied the summed absolute value signal and the second pole of said switch is applied the d-c level signal, wherein the switch position determines, via a pair of switch hitter amplifiers, the polarity of the summed absolute value signal and the d-c level signal, wherein these signals are applied to a voltage comparator circuit that produces a high-level signal, and to a voltage-to-current converter circuit that produces a low-level signal, wherein the two signals are summed to produce the attenuator signal.

9. An audio processor comprising:

a) a single-ended, limited compressor/expander circuit designed to produce compression or expansion of an audio signal, wherein the compression or expansion is created by offsetting the audio signal to a new level, said circuit having a channel A section and a channel B section, where each said section comprises:

(1) a non-inverting amplifier that is applied an audio signal from an audio source and produces a buffered audio signal, (2) a level-set potentiometer which allows the audio signal level to be optimally set, where said level-set potentiometer is connected across a d-c voltage source and produces a voltage level signal and a reference voltage level that are applied to a difference amplifier that produces a difference voltage level signal, (3) an electronic potentiometer circuit having an input voltage controlled amplifier and an output voltage controlled amplifier where the control of said input voltage controlled amplifier is affected by the voltage level signal, and the output voltage controlled amplifier is affected by the difference voltage level signal, wherein the buffered amplitude of the audio signal is increased or decreased by the input voltage controlled amplifier to produce a source audio signal, (4) an absolute value circuit having means for performing full-wave rectification of the applied source audio signal and producing a channel A absolute value signal, (5) a display driver that is applied the channel A absolute value signal and drives an LED display that indicates the internal signal level of said audio processor, (6) a threshold set circuit that comprises a first threshold potentiometer that is applied the channel A absolute value signal and a second threshold potentiometer that is applied a channel B absolute value signal from a channel B absolute value circuit, where the wipers of said first and second threshold potentiometer are summed and applied through an amplifier that produces a summed absolute value signal, (7) a peak voltage detector that is applied the summed absolute value signal and develops a d-c level proportional to the peak amplitude of the summed absolute value signal and produces a d-c level signal, (8) a switch-hitter circuit having a double-pole, double-throw switch that determines the compressor/ expander function of said audio processor, wherein the first contact of the first pole of said switch is applied the summed absolute value signal and the first contact of the second pole of said switch is applied the d-c level signal, wherein the switch signals are applied to a set of switch-hitter amplifiers wherein the signals are either sourced through the switch hitter amplifiers or subtracted from a reference voltage by the switch hitter amplifiers dependent upon the position of the compression/expansion switch, wherein the output of the switch hitter amplifier sourced the summed absolute value signal and produces a d-c referenced absolute value signal and the amplifier sourced the d-c level signal produces a d-c referenced level signal wherein the d-c referenced absolute value signal is applied to a voltage comparator circuit that produces a high level signal and the d-c referenced level signal is applied to a voltage to current converter circuit that produces a control current sink proportional to the summed absolute value signal to create a low level signal, wherein the two signals are summed to produce an attenuator signal, (9) an electronic attenuator that increases or decreases the amplitude of the source audio signal relative to the attenuator signal and produces a level processed audio signal, b) an output circuit comprising:

(1) a dynamic noise reduction (DNR) circuit that is applied the level processed audio signal and produces a processed audio signal, and (2) a buffer circuit that is applied the processed audio signal producing a buffered processed audio signal that is applied to said output potentiometer from where a channel A output audio signal is produced.

10. The audio processor as specified in claim 9 wherein said audio source comprises an audio tape, a compact disc, a synthesized sound or a natural or artificial sound.

11. The audio processor as specified in claim 9 wherein when an audio signal is present, said level set potentiometer is adjusted to optimize internal signal levels.

12. The audio processor as specified in claim 9 further comprises a threshold display drive circuit that is applied the summed absolute value signal, where said drive circuit enables an LED display that illuminates during the peak levels of the audio signal.

13. The audio processor as specified in claim 9 wherein said voltage comparator circuit comprises two voltage comparators, wherein said first voltage comparator is set to trip a reference voltage (VREF) and said second voltage comparator is set to trip at 2 dB higher than VREF.

14. The audio processor as specified in claim 9 wherein said peak voltage detector further comprises a single-pole, double-throw compress/expand switch and a low-level, threshold set potentiometer, wherein wherein said switch is placed in the compress position said peak voltage detector is set at a fixed gain, and when said potentiometer allows the gain of said peak detector to be varied when said switch is placed in the expand position.

* * * * *